United States Patent [19]
Hulick

[11] Patent Number: 5,724,002
[45] Date of Patent: Mar. 3, 1998

[54] ENVELOPE DETECTOR INCLUDING SAMPLE-AND-HOLD CIRCUIT CONTROLLED BY PRECEDING CARRIER PULSE PEAK(S)

[75] Inventor: Timothy P. Hulick, Schwenksville, Pa.

[73] Assignee: Acrodyne Industries, Inc., Blue Bell, Pa.

[21] Appl. No.: 662,604

[22] Filed: Jun. 13, 1996

[51] Int. Cl.[6] .................................................. H03D 1/02
[52] U.S. Cl. ........................ 329/361; 329/362; 329/363; 455/337
[58] Field of Search .................................. 329/361, 362, 329/363, 364; 455/337; 375/320

[56] References Cited

U.S. PATENT DOCUMENTS

| | | | |
|---|---|---|---|
| 3,154,749 | 10/1964 | Perkins | 329/361 |
| 3,378,779 | 4/1968 | Priddy | 329/349 |
| 3,651,419 | 3/1972 | Janz | 329/362 |
| 4,031,479 | 6/1977 | Thomas, Jr. et al. | 329/361 |
| 4,393,352 | 7/1983 | Volpe et al. | 329/349 |
| 4,426,623 | 1/1984 | Wilkens et al. | 329/362 |
| 4,617,521 | 10/1986 | Fox | 329/362 |

*Primary Examiner*—Siegfried H. Grimm
*Attorney, Agent, or Firm*—Reid & Priest LLP

[57] ABSTRACT

A sampling synchronous envelope detector adopts a specialized sample-and-hold ("S&H") approach, basing a detected output on instantaneous values of the carrier waveform which are sampled at specially chosen instants. Non-linear distortion is avoided by timing the sampling instants to occur at or near a carrier wave peak which is subsequent to an earlier carrier wave peak which serves as a time base. Sampling instants occur only at or near positive carrier peaks (or only at or near negative peaks) in a half-wave embodiment, and sampling instants occur at or near both positive and negative carrier peaks in a full wave embodiment. Another aspect of the detector provides means, such as a phase locked loop, for ensuring that the phase of the sampling instants is maintained continuously, even in the event of carrier pinch-off or other event which distorts or minimizes the carrier waveform from which the timing instants would otherwise be determined. Still another aspect of the detector provides for low pass filtering, and group delay equalization of the filtered signal, before it is output.

30 Claims, 5 Drawing Sheets

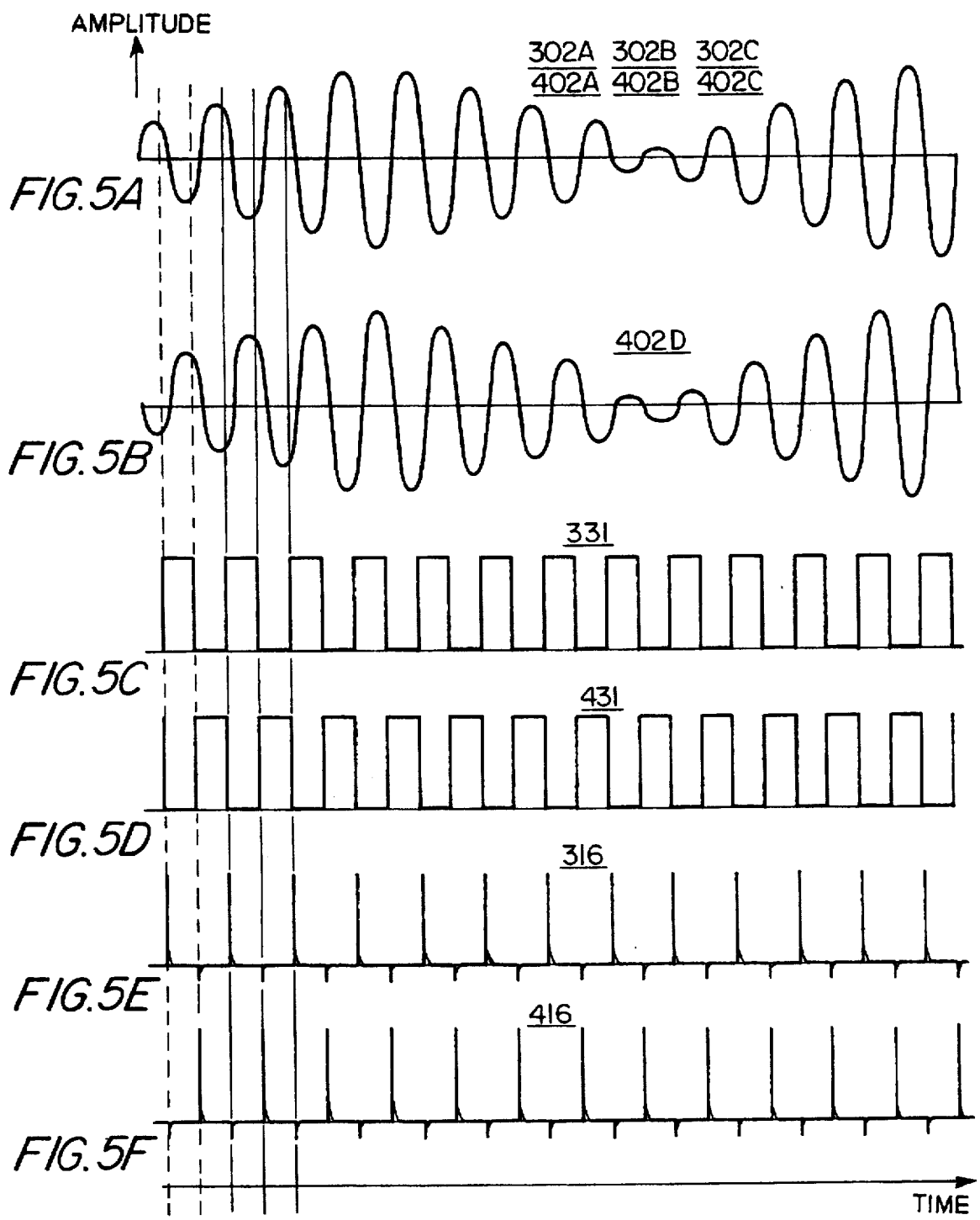

TIME

ENVELOPE DETECTOR INCLUDING SAMPLE-AND-HOLD CIRCUIT CONTROLLED BY PRECEDING CARRIER PULSE PEAK(S)

BACKGROUND OF THE INVENTION

1. Field of the Invention

The present invention relates to envelope detectors for detecting envelopes of signal waveforms. More specifically, the invention relates to electronic envelope detectors, especially suitable for linear, distortion-free detection of amplitude-modulated (AM) waveforms.

2. Related Art

The PN junction signal diode, being a simple individual component, has long been used for inexpensive amplitude modulation detection. However, the I-V transfer characteristic of the PN junction signal diode shown in FIG. 1 illustrates its shortcomings as an envelope detector.

The signal diode's I-V transfer function is not linear, and does not pass through the origin. This transfer function results in signal distortion, especially of small signals. Bias may be applied to move the V-axis crossing so that the curve passes through the origin, but this does not resolve the linearity problem, at either small or large signal amplitudes. Accordingly, use of a PN junction signal diode necessarily results in a distorted demodulated signal.

The tunnel diode offers a small improvement over the signal diode in the context of envelope detection. As shown in FIG. 2, the I-V characteristic of the tunnel diode passes through the origin, thus reducing distortion in small-amplitude signals without requiring bias. Further, the useful detection part of the curve is more linear than that of the signal diode. However, some nonlinearity is still characteristic of the tunnel diode, rendering it unacceptable as an envelope detector in many applications.

Accordingly, there is a need in the art for a relatively simple yet reliable system and method of detecting signal envelopes which do not introduce distortion. It is to fulfill this need that the present invention is directed.

Various types of envelope detectors, more sophisticated than simple diode detectors, are known in the art. U.S. Pat. No. 4,617,521 (Fox) discloses an S&H (sample-and-hold) demodulator involving active components and a switched capacitor. U.S. Pat. No. 4,426,623 (Wilkens et al.) discloses an AM demodulator in which there are two S&H circuits, the goal of the Wilkens et al. arrangement being to reduce ripple. U.S. Pat. No. 4,393,352 (Volpe et al.) discloses an active RC filter involving an S&H approach. U.S. Pat. No. 3,651,419 (Janz) is directed to a peak demodulator in which peak detector(s) sample positive and negative peaks and produce a pulse which closes switch(es) allowing an input signal to be sampled by charging a capacitor which is at the output of the switch(es). U.S. Pat. No. 3,378,779 (Priddy) discloses an early demodulator. Finally, U.S. Pat. No. 3,154,749 (Perkins) discloses an early envelope detector involving an S&H approach.

However, none of these systems perform the envelope detection in the same way as the present invention, or with the advantages possessed by the present invention.

SUMMARY OF THE INVENTION

The inventive envelope detector provides a long-needed improvement over PN junction diode detectors, tunnel diode detectors, and other envelope detectors. It is superior in performance because envelope detection is not dependent on the transfer characteristics of a diode or any other detection device. Accordingly, the detector itself does not constitute a source of distortion.

The present invention provides what may be termed a sampling synchronous envelope detector. It adopts a specialized sample-and-hold ("S&H") approach, basing a detected output on instantaneous values of the carrier waveform which are sampled at specially chosen instants.

The invention envisions at least two exemplary embodiments: a half-wave embodiment and a full-wave embodiment. In either embodiment, the inventive sampling synchronous envelope detector introduces no nonlinear distortion. Such distortion is avoided by timing sampling instants to occur at or near a carrier wave peak which is subsequent to an earlier carrier wave peak which serves as a time base. Sampling instants are timed to occur only at or near positive carrier peaks (or only at or near negative peaks) in the exemplary half-wave embodiment, and sampling instants occur at or near both positive and negative carrier peaks in the exemplary full wave embodiment. As used in this specification, a "peak" denotes a maximum-amplitude portion of a pulse, and may encompass positive maximum values (the narrower definition of a "peak") and negative maximum-amplitude values (which others may more narrowly define as a "trough").

Another aspect of the invention provides means, such as a phase locked loop, for ensuring sampling instants are maintained continuously, even in the event of carrier pinch-off or other event which distorts or minimizes the carrier waveform from which the sampling instants are determined.

Still another aspect of the invention provides for low pass filtering, and group delay equalization of the filtered signal, before it is output.

Other objects, features and advantages of the invention will become apparent from the following detailed description of the preferred embodiments and the accompanying drawing figures.

BRIEF DESCRIPTION OF THE DRAWINGS

The invention is better understood by reading the following Detailed Description of the Preferred Embodiments with reference to the accompanying drawing figures, in which like reference numerals refer to like or similar elements throughout, and in which:

FIGS. 5A through 5I, which are hereinafter referred to collectively as "FIG. 5", constitute a timing diagram showing waveforms found at various points in the exemplary circuits of FIGS. 3 and 4.

DETAILED DESCRIPTION OF THE PREFERRED EMBODIMENTS

Figure 1:
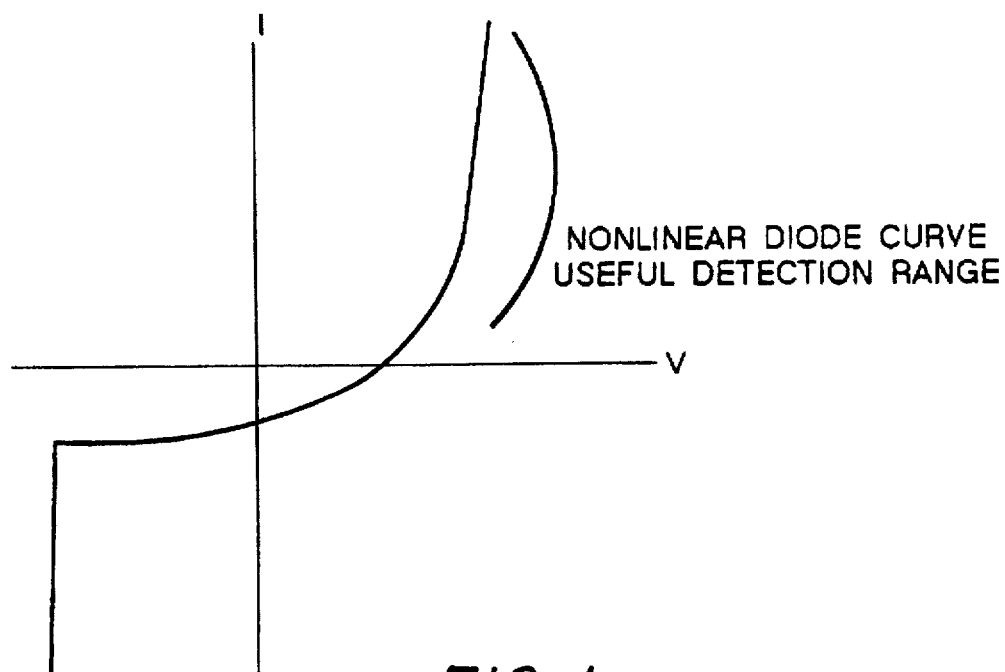
FIG. 1 illustrates the I-V characteristic of a PN junction signal diode, for demonstrating the nonlinearity it introduces into detector circuits.
Figure 2:
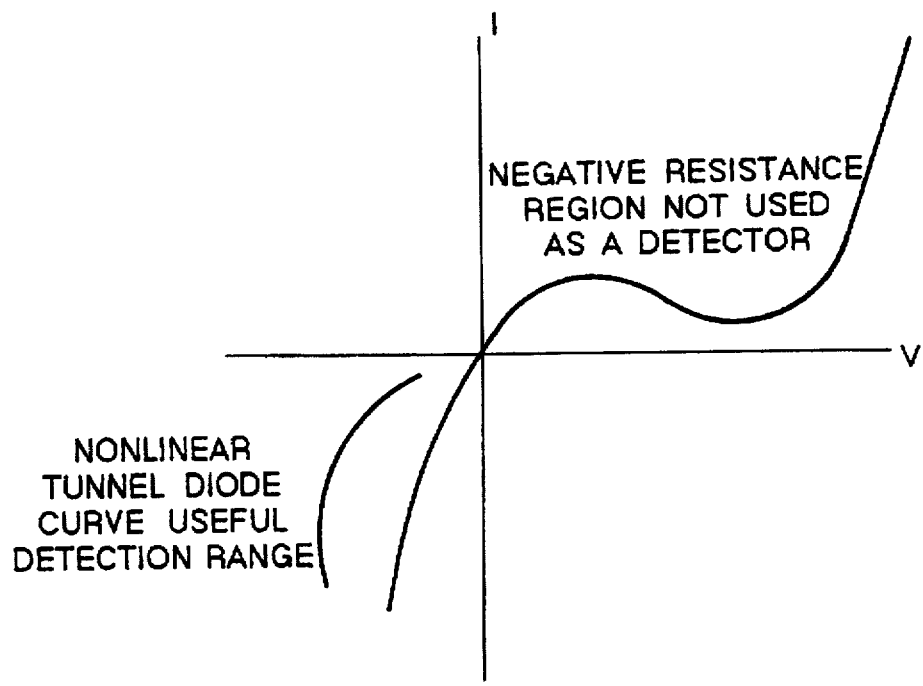
FIG. 2 illustrates the I-V characteristic of a tunnel diode, for demonstrating the nonlinearity it introduces into detector circuits.

In describing preferred embodiments of the present invention illustrated in the drawings, specific terminology is employed for the sake of clarity. However, the invention is not intended to be limited to the specific terminology so selected, and it is to be understood that each specific element includes all technical equivalents which operate in a similar manner to accomplish a similar purpose.

The preferred embodiment of the inventive envelope detector includes a sample-and-hold (S&H) circuit which samples and holds the carrier wave input voltage value at or near a peak positive (and/or negative) point of each RF carrier cycle. This value is held until renewed by sampling and holding a peak positive (and/or negative) value of the next cycle in time. If only peak positive (or only negative) envelope values are stored, rectification takes place and the RF carrier is eliminated. The result is linear envelope detection.

In the following description of a preferred embodiment, certain assumptions are made:

First, operational amplifiers ("op amps") are assumed to have zero output impedance, infinite input impedance, and infinite open loop gain. Modern operational amplifiers very nearly meet these assumptions since an open loop bandwidth of 500 MHz or more, an output impedance of tens of milliohms or less, and an input impedance of megohms along with open loop gain of more than 100 dB, are all available in the same op amp.

Second, operational amplifiers are assumed to be capable of linearly amplifying a signal at common IF frequencies where desired amplitude detection takes place, and with very low distortion.

Third, it is established that modern voltage comparators are capable of stable operation with an input signal frequency greater than 50 MHz, well above the intermediate frequency at which envelope detection takes place in most applications.

Fourth, it is assumed that propagation delay through a voltage comparator is a function of the degree of overdrive to its input relative to its reference voltage, but that beyond only tens of millivolts overdrive, the time delay is constant.

Finally, it is preferred that the source impedance driving the exemplary detector circuits (described below) is nominally 50 ohms.

Of course, these assumptions are mentioned as background for describing preferred embodiments of the present invention, and are not strictly required of a particular real-world circuit to fall within the scope of the claims. Thus, the scope of the invention should not be limited to any or all of the foregoing.

Figure 3:
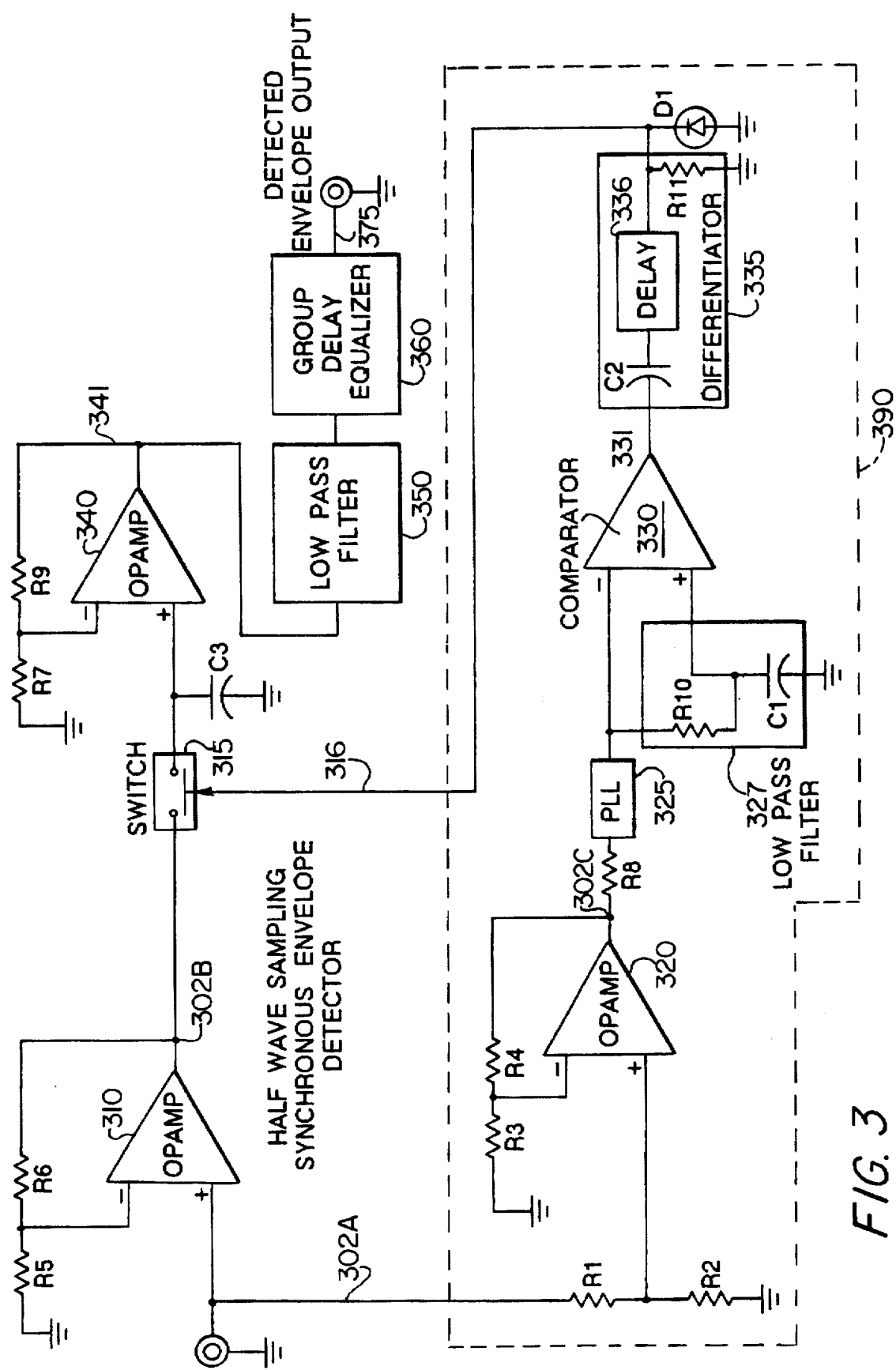
FIG. 3 illustrates a preferred embodiment of a half-wave sampling synchronous envelope detector according to the present invention.
Figure 4:
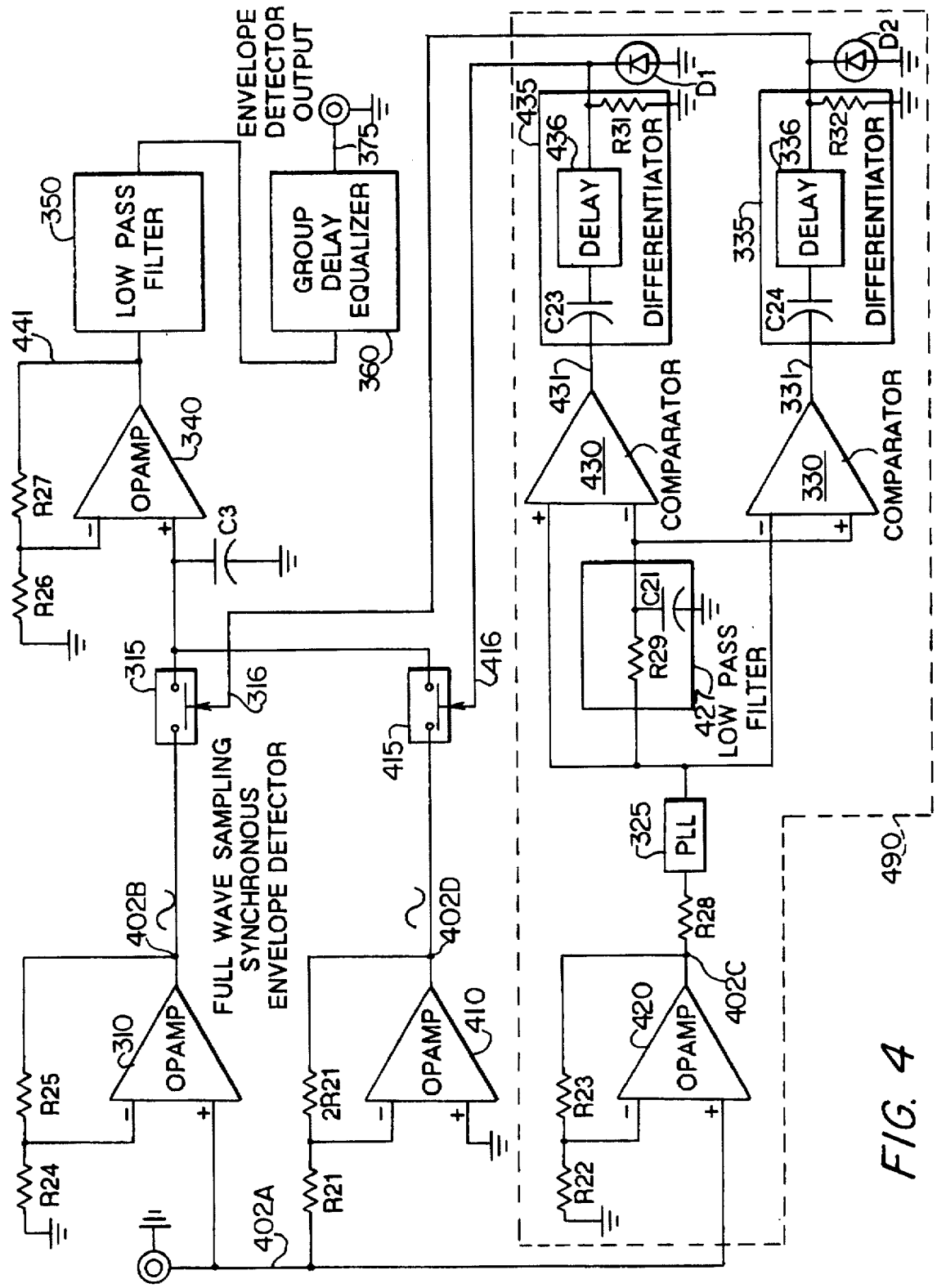
FIG. 4 illustrates a preferred embodiment of a fun-wave sampling synchronous envelope detector according to the present invention.

FIG. 3 illustrates a preferred embodiment of a half-wave sampling synchronous envelope detector according to the present invention. FIG. 4 illustrates a preferred embodiment of a full-wave sampling synchronous envelope detector according to the present invention. The FIG. 3 half-wave circuit may be considered a subset of the FIG. 4 full-wave circuit, as its sample-and-hold circuitry is triggered on carrier wave pulses of only one polarity. The sample-and-hold circuitry of full-wave embodiment of FIG. 4 is triggered on carrier pulses of both polarities.

Figure 5G:
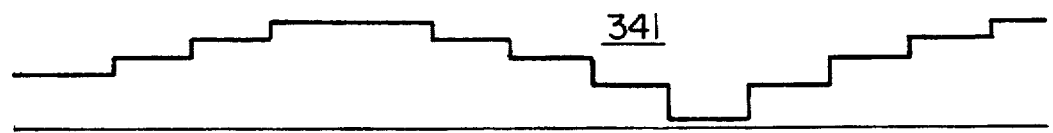
Figure 5H:
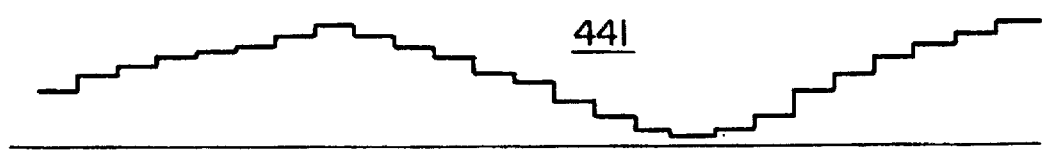
Figure 5I:
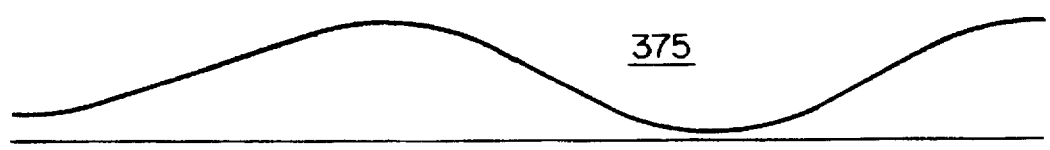

FIG. 5 is a timing diagram showing waveforms found at various points in the exemplary circuits of FIGS. 3 and 4. Element reference numerals in FIG. 5 refer to the similarly numbered nodes in FIGS. 3 and 4.

Referring especially to FIG. 3, an amplitude modulated RF carrier signal is input on node 302A to a buffer operational amplifier ("op amp") 310. Op amp 310 is in series with a switch 315 (preferably a CMOS transistor) which is connected to a capacitor C3. Capacitor C3 drives another op amp 340, which is connected in series with a low pass filter 350 and a group delay equalizer 360 which outputs the detected envelope output signal on node 375. A control signal 316 for switch 315 is formed from the following control circuitry 390.

The input signal on node 302A drives a buffer op amp 320 which is in series with an optional phase locked loop 325, a comparator 330 (functioning as a rise/fall indicator), and a differentiator 335 which provides a sample pulse on node 316 which drives the gate (control input) of switch 315. The operation of these and other elements in FIG. 3 is described in greater detail below.

FIG. 4 illustrates a preferred embodiment of a full-wave sampling synchronous envelope detector according to the present invention. The full-wave embodiment includes many elements corresponding closely to elements in the half-wave embodiment of FIG. 3. For example, FIG. 4 elements 310, 315, 340, 350, and 360, as well as elements 325, 330 and 335, are identical to or functional equivalents of like-numbered elements in FIG. 3. Control circuitry 490 corresponds generally to FIG. 3 control circuitry 390.

However, additional elements are also present in FIG. 4 which are not present in FIG. 3, to allow detection of both positive and negative pulses of the input carrier waveform.

An additional op amp 410 and switch 415 are provided, in parallel with op amp 310 and switch 315. Both op amps selectively feed capacitor C3 under control of the respective switches.

Likewise, a comparator 430 and differentiator 435 are provided, in parallel to comparator 330 and differentiator 335. These sets of comparators and differentiators provide respective control signals 316, 416 to switches 315 and 415.

FIG. 4 op amp 420, resistor R28, and LPF 427 perform functions similar to corresponding elements 320, R8, and 327. The operation of these corresponding elements need not be described in duplicate. However, it is preferred that only a single LPF 427 be provided in the full-wave embodiment, so that the same precise peak is determined by both comparators 330, 430 in FIG. 4.

The operation of the illustrated embodiments is now described, focusing on the half-wave embodiment but with the understanding that its principles of operation extend to the full-wave embodiment.

Referring to the half-wave sampling synchronous envelope detector in FIG. 3 and to corresponding timing waveforms in FIG. 5, an amplitude-modulated (AM) radio frequency (RF) or intermediate frequency (IF) carrier on node 302A drives the non-inverting input of op amp 310. In a particular preferred embodiment, resistors R5 and R5 are chosen so that op amp 310 has an arbitrary gain of 2.

The same AM signal on node 302A drives the non-inverting input of op amp 320, with resistor values R1 and R2 chosen to give op amp 320 an arbitrary gain of 1. Series resistors R1 and R2 make up the nominal 50 ohm load to the driving source. The output signal of op amp 310 is thus two times the voltage output level of op amp 320. Otherwise, the op amps 310 and 320 may be considered identical in function, with both serving essentially as buffers.

Op amp 310 provides an output on node 302B to a switch illustrated as element 315. In the preferred embodiment, the switch is an RF CMOS transistor whose on-off state is controlled by a logic level 316 provided to the transistor's gate. When logic level 316 to the gate is high, switch 315 is a closed circuit; when the logic level to the gate is low, the RF switch is an open circuit.

The gate is the controlling element of the switch, and ideally never affects the switch otherwise except for minuscule leakage current which does not substantively affect operation of the envelope detector circuit as a whole. Preferably, the switch is on for a very small fraction of the carrier period, so that switch 315 essentially causes the output of op amp 310 to be sampled and held by capacitor C3. This sampled voltage is held until the next carrier wave pulse's sample.

The output of op amp 320 drives the inverting input of a voltage comparator 330. Between op amp 320 and comparator 330 are a resistor R8, an optional phase locked loop 325, and an R-C pair functioning as a low pass filter 327. The low pass filter 327 includes a resistor R10 connected between the inputs of the comparator, and a capacitor C1 connecting the comparator's non-inverting input and ground. Resistor R8 is incidental to the concept of operation of the envelope detector.

However, it is significant that the signal output from op amp 320 feeds the non-inverting input through the time lag (low pass filter) circuit. Due to the time constant determined by R10 and C1, the voltage signal at the non-inverting input to comparator 330 always lags the signal at its inverting input. A time constant of, for example, 2.8 nanoseconds may be arbitrarily selected for a carrier frequency of 45 MHz so that the polarity of the differential signal across the two inputs of the comparator changes immediately after the positive and negative peaks of the RF carrier.

Thus, the combination of the low pass filter and comparator function as a trigger which changes state immediately after the carrier waveform changes direction. Because this change of direction occurs at (that is, within 2.8 nanoseconds after) peaks of the carrier waveform, the edges of the comparator's output can be considered peak indicators.

More specifically, as shown in FIG. 5C, just after a positive peak in the carrier signal, the comparator output 331 goes to a high logic level. Similarly, just after the negative peak, the comparator output goes to a logic zero. The comparator thus outputs what is essentially a square wave, assuming a generally regular sinusoidal input carrier. In the illustrated half-wave embodiment, only one of the two transitions, namely the positive-going transition, serves as a time base for the sample and hold switch 315.

The output of comparator 330 is differentiated so that only a very short-duration pulse at the rising edge of the comparator's square wave output pulses is input to the control input of switch 315. Differentiator 335 preferably includes a series arrangement of a capacitor C2, a delay line 336, and a resistor R11. In the FIG. 3 embodiment, a Schottky diode D1 clips the unused spikes extending toward the opposite polarity.

Advantageously, the delay line may be selected to cause the envelope detector to work in a variety of ways. If a short delay (or no delay) is selected, switch 315 goes to its "on" state immediately after the peak of the present pulse of the carrier wave. Alternatively, with larger delays, the delay may be selected to cause switch 315 to go to its "on" state at a later time, such as (preferably) the precise amplitude peak of a subsequent carrier peak.

Generally, the timing delay should be chosen so that the switch is closed momentarily at the peak of any subsequent cycle (or, if desired, any other consistently chosen time in the carrier cycle). The absolute duration of the delay is somewhat arbitrary, but the delay should be such that sampling does not take place while the carrier waveform is at or near its zero crossover. Setting the time delay to cause closure of the switch at the very peak produces the highest-amplitude demodulated signal, to thus maximize detection gain and signal-to-noise ratio (SNR).

When switch 315 is on, the voltage across holding capacitor C3 is updated. In the half-wave detector of FIG. 3, the voltage on the capacitor is updated at a rate equal to the carrier frequency since the positive peaks of the carrier determine the output state of the comparator 330. The output impedance of op amp 310, which supplies the electrical charge to capacitor C3, is assumed to be very low so that the op amp may inject or remove charge from the capacitor substantially instantaneously.

Op amp 340 amplifies the voltage on capacitor C3 to a desired level. A low pass filter 350 preferably follows op amp 340 to eliminate switching frequency components caused by the discretely-timed sampling updates described above. The corner frequency of the filter should be determined based on the highest frequency component of the baseband modulating signal which is being detected.

Certain technical details of the embodiment are now provided for the sake of completeness, with the understanding that variations of circuit content, circuit topology, and component values may be made by those skilled in the art without departing from the scope of the invention. Reference is made especially to FIG. 3 with the understanding that similar corresponding components in FIG. 4 function in a like manner and may therefore be similarly chosen by those skilled in the art.

In FIG. 3, R1 and R2 form the desired input termination impedance. In the FIG. 4 embodiment, R21 provides the desired input termination impedance.

The resistor-capacitor combinations at the inputs of the comparators in FIGS. 3 and FIG. 4 determine how soon after the carrier peaks the comparator(s) change state. Specifically, the values of R10 and C1 determine a time constant which determines the delay past the true carrier peak at which comparator 330 changes state. It has been demonstrated, for example, that a time constant of 1.2 nanoseconds is realizable using comparators such as the Maxim MAX 913.

Resistor R11 provides a suitable termination load to delay line 336, and also functions with capacitor C2 to differentiate the square wave output by the comparator 330. In the illustrated embodiment, diode D1 clips the negative pulses so that only positive pulses reach the switch 315. Advantageously, the R-C time constant at the input of the comparator is not required to be of close tolerance because the comparator state change does not have to happen precisely at the peak: it is sufficient that it occur at the same point in each cycle.

The comparator will change state at the same point in each cycle if the R-C time constant at its input is maintained substantially constant. Turning on the switches 315, 415 at a peak of a subsequent cycle is preferable, as it maximizes the output signal and therefore offers the greatest signal to noise ratio of the detector as a whole. The particular turn-on time of switches 315, 415 is set by delay line(s) 336, 436 at the output of the comparators, rather than by the R-C combinations at their input.

Applying connections to the operational amplifiers and the comparators such as supply voltages, as well as choosing the values and connection of other elements in the illustrated circuits, lie well within the ability of those skilled in the art and are not necessary to explain the operation of the circuit. Also, the particular values of other resistors and other components to achieve desired waveform levels and other waveform characteristics lies well within the ability of those skilled in the art. Accordingly, further discussion of such details is not needed to describe the invention or enable those skilled in the art to make and use it.

The structure and operation of embodiments of the present invention having been provided above, some of the advantages and conceptual observations relating to the invention are now presented. It is understood to those skilled in the art that other advantages may accrue, and that these or other conceptual observations are not necessary to describe the invention or allow those skilled in the art to make and use it.

In many cases, it is desirable to exclude quadrature modulation components of supposedly purely amplitude modulated carrier waves in the detection or demodulation process. This is because the quadrature modulation is usually due to undesirable carrier wave modulation such as "incidental carrier phase modulation." This undesirable effect occurs in supposedly "linear" amplifiers which are not truly linear in the transmitter after the modulation process has taken place.

The addition of the quadrature modulation component results in a modulated signal with an X component (the desirable "intended" component) and a small Y component (the undesirable, "unintended" component) causing a resultant Pythagorean Z component. Unfortunately, envelope detectors cannot distinguish the Z value from the desired X component.

Synchronous detectors may be used to extract the X and Y components separately, and the Y component may be discarded if desired. In vestigial sideband modulation, a Y component is intentionally generated, and is a necessary component as a result of the asymmetry of the upper and lower sidebands. A synchronous detector finds the X and Y components separately. These two components are independently squared, the squares are summed, and the square root of the sum is determined so as to find a Z value. However, this is a slow process which severely limits the maximum carrier frequency and modulation bandwidth which may be accommodated in a practical circuit. Using a simple diode demodulator finds the resultant Z directly, but as described in the Background of the Invention the diode detector circuit is nonlinear and thus introduces distortion.

An advantage of the present invention is that the invention preserves the full envelope of the detected signal, Z, without introducing the distortion of conventional diode detectors.

The embodiments of both FIG. 3 and FIG. 4 use the modulated carrier wave signal itself as a reference for the comparator(s), unlike known systems.

The invention smoothes the sample detected signal by filtering with a low pass filter 350 to rid the sampled signal of switching spikes. A group delay equalizer all-pass filter 360 counters the group delay distortion naturally introduced by the low pass filter.

As mentioned above, an advantage of either embodiment of the present invention is that it preserves the full envelope of the detected signal, Z, without introducing the distortion of conventional diode detectors.

It is recognized that the full-wave embodiment of FIG. 4 includes more circuitry than the half-wave embodiment of FIG. 3. In some instances, the FIG. 3 half-wave embodiment performs substantially as well as the FIG. 4 full-wave embodiment. The exemplary half wave circuit in FIG. 3 may be used if the carrier frequency is much greater than the frequency spectrum of the modulating signal: for low-frequency modulation, the carrier wave peaks occur often enough to update the holding capacitor C3 for successful linear detection.

However, the full-wave embodiment is preferable over the half-wave embodiment when the frequency of the modulating signal approaches the carrier frequency. The preferred performance of the full-wave embodiment derives from the fact that, for the half-wave detector of FIG. 3, sampling occurs only at the carrier frequency because peaks of only one polarity (positive or negative) trigger the comparator. However, for the full-wave detector of FIG. 4, sampling occurs at twice the carrier frequency because peaks of both polarities (positive and negative) trigger the comparator.

An exemplary application of the present invention is to detect an NTSC television baseband video signal on a carrier wave with modulation components as high as 4.18 MHz at an IF carrier frequency of 45.75 MHz. In this application, the full wave embodiment of the inventive envelope detector offers no advantage over the half wave circuit because the Nyquist criterion is met in both cases: specifically, in FIG. 4, the Nyquist criterion:

$$(2\times 45.75)\ MHz > (2\times 4.18)\ MHz$$

is met, but in FIG. 3, the Nyquist criterion:

$$45.75\ MHz > (2\times 4.18)\ MHz$$

is also met. In contrast, if the carrier frequency were at a non-standard value (such as 5 MHz, for example), then only the full wave embodiment should be used.

Specifically, in FIG. 3:

$$5\ MHz < (2\times 4.18)\ MHz$$

and the Nyquist criterion is not met. But in FIG. 4, the Nyquist criterion:

$$(2\times 5)\ MHz > (2\times 4.18)\ MHz$$

is met. The half-wave circuit in FIG. 3 would not sample often enough, and incurable aliasing would occur in the baseband television demodulated signal. Accordingly, there are instances in which the use of the extra circuitry of FIG. 4 is justified.

Another issue of concern in envelope detection is when the carrier amplitude is substantially reduced, making it more difficult to detect its envelope. For example, for high modulation percentages, carrier pinch-off is approached, the magnitude of the carrier signal output from op amps 320, 420 is too small to trigger a change of state in the comparators' outputs. By implication, the comparator (peak detector) ceases to operate properly, and demodulation is interrupted. For modulation as high as (for example) 95% to 100%, the phase locked loop (PLL) circuit 325 in FIGS. 3 and 4, locked to the carrier wave in phase and frequency, is preferably used. The carrier wave input to the PLL free-runs during any interruption in the input signal and allows continuous demodulation even during carrier pinch-off, and during other events in which the carrier wave is momentarily too low in amplitude to be used as a reference for the comparator.

Modifications and variations of the above-described embodiments of the present invention are possible, as appreciated by those skilled in the art in light of the above teachings. For example, the particular resistance and capacitance values, and the choice of particular implementations of the operational amplifiers and comparators may be varied without departing from the scope of the present invention. Indeed, the operational amplifiers and comparators exemplified above may be replaced with other implementations appreciated by those skilled in the art, provided the requisite functions are performed as claimed. It is therefore to be understood that, within the scope of the appended claims and their equivalents, the invention may be practiced otherwise than as specifically described.

What is claimed is:

1. A synchronous sampling envelope detector, comprising:
   an input for receiving a carrier waveform which includes a series of pulses; and
   means, responsive to a detected maximum-magnitude value of a present pulse of the carrier waveform, for sampling an instantaneous value of the carrier waveform at a time which is delayed to a portion of a subsequent pulse of the carrier waveform which occurs after the present pulse.

2. A synchronous sampling envelope detector for detecting an envelope of a carrier waveform which includes a series of pulses, the detector comprising:
   a) an input which receives the carrier waveform;
   b) a switch having:
      1) a signal input which is responsive to the carrier waveform;
      2) an output; and
      3) a control input for determining whether the switch is "on" to connect the output to the signal input or "off" to disconnect the output from the signal input;
   c) a holding device, responsive to the switch's output, for receiving a sample of the switch output's instantaneous amplitude when the switch is on, and for holding the sample as being indicative of the carrier waveform's instantaneous amplitude after the switch has been turned off; and
   d) control means, responsive to the carrier waveform, for determining a maximum-magnitude value of a present pulse of the carrier waveform and for providing a sample signal to the switch's control input at a time delay after the determined maximum-magnitude value which occurs during part of a subsequent pulse of the carrier waveform, so as to cause the holding device to sample and hold the sample which is indicative of the instantaneous amplitude of the carrier waveform.

3. The detector of claim 2, further comprising:
   a low pass filter for smoothing discretely-timed variations in the samples stored in the holding device.

4. The detector of claim 3, further comprising:
   a group delay equalizer, connected to the low pass filter.

5. The detector of claim 2, wherein the control means includes:
   means for allowing the control means to continue to cause the holding device to sample and hold the value indicative of the instantaneous amplitude of the carrier waveform at phases which remain consistent, even when the carrier waveform is substantially reduced in magnitude.

6. The detector of claim 5, wherein the means for allowing includes:
   a phase locked loop, locked in frequency and phase to the carrier waveform, for providing a continuous-phase signal for detection of the maximum-magnitude value even when the carrier waveform is substantially reduced in magnitude.

7. A method of detecting an envelope of a carrier waveform which includes a series of pulses, the method comprising:
   beginning a time period in response to a detected peak of a present pulse of the carrier waveform;
   determining an end of the time period during a subsequent pulse of the carrier waveform which occurs after the present pulse; and
   sampling an instantaneous amplitude of the carrier waveform at the end of the time period.

8. The detector of claim 2, wherein the control means includes:
   a buffer which receives the carrier waveform and provides a buffered waveform;
   slope indication means, responsive to the buffered waveform, for providing a slope indication signal which changes state substantially at peaks of positive and negative polarity; and
   a differentiator which is responsive to the slope indication signal to provide to the switch's control input, a narrow pulse constituting the sample signal.

9. The detector of claim 8, wherein:
   the buffer includes an operational amplifier.

10. The detector of claim 8, wherein the control means further includes:
    a phase locked loop, responsive to the buffered waveform and which provides a reference signal to the slope indication means even when the buffered waveform is small in magnitude.

11. The detector of claim 8, wherein the slope indication means includes:
    a) a low pass filter (LPF) which is responsive to a first signal derived directly from the buffered waveform and which provides a slightly delayed version of the first signal; and
    b) a comparator having:
       1) a first input which is directly responsive to the first signal;
       2) a second input which is responsive to the delayed version of the first signal; and
       3) a comparator output which changes the slope indication signal's value when the first input's value crosses the second input's value.

12. The detector of claim 8, wherein the differentiator includes:
    a delay element which substantially determines the time delay which expires during the subsequent pulse of the carrier waveform.

13. The detector of claim 8, wherein the control means further includes:
    a limiter which clips narrow pulses of a predetermined polarity so that only narrow pulses of a second polarity opposite the predetermined polarity affect the sample signal.

14. The detector of claim 8, wherein:
    a) the buffer includes an operational amplifier;
    b) the control means further includes a phase locked loop, responsive to the buffered waveform and which provides a reference signal to the slope indication means even when the buffered waveform is small in magnitude;
    c) the slope indication means includes:
       1) a low pass filter which is responsive to a first signal derived directly from the buffered waveform and which provides a slightly delayed version of the first signal; and
       2) a comparator which has a first input which is directly responsive to the first signal and a second input which is responsive to the delayed version of the first signal, and which changes the slope indication signal's value when the first input's value crosses the second input's value;

d) the differentiator includes a delay element which substantially determines the time delay which expires during the subsequent pulse of the carrier waveform; and e) the control means further includes a limiter which clips narrow pulses of a predetermined polarity so that only narrow pulses of a second polarity opposite the predetermined polarity affect the sample signal.

15. The detector of claim 2, wherein:

the control means constitutes a hardware circuit.

16. The detector of claim 15, wherein:

the hardware circuit includes discrete active and passive electronic components.

17. A full wave synchronous sampling envelope detector for detecting an envelope of a carrier waveform which includes a series of pulses, the detector comprising:

a) an input which receives the carrier waveform;

b) a first buffer which provides a first buffered waveform in response to the carrier waveform;

c) a first switch having:
1) a first signal input which is responsive to the first buffered waveform;
2) a first output; and
3) a first control input for determining whether the first switch is "on" to connect the first output to the first signal input or "off" to disconnect the first output from the first signal input;

d) an inverter which provides an inverted waveform in response to the carrier waveform;

e) a second switch having:
1) a second signal input which is responsive to the inverted waveform;
2) a second output; and
3) a second control input for determining whether the second switch is "on" to connect the second output to the second signal input or "off" to disconnect the second output from the second signal input;

f) a holding device, responsive to the first and second switches' outputs, for receiving samples of the first and second switches' outputs' instantaneous amplitudes when the respective switches are on, and for holding successive sample values indicative of the carrier waveform's instantaneous amplitude after the switches have been turned off; and g) control means, responsive to the carrier waveform and which determines respective peak and trough maximum-magnitude values of present pulses and which provides first and second sample signals to the respective first and second control inputs of the first and second switches at time delays after the determined peak and trough maximum-magnitude values which occurs during part of respective subsequent pulses of the carrier waveform, so as to cause the holding device to sample and hold values indicative of the instantaneous amplitude of the carrier waveform.

18. The detector of claim 17, further comprising:

a low pass filter for smoothing discretely-timed variations in the samples stored in the holding device.

19. The detector of claim 18, further comprising:

a group delay equalizer, connected to the low pass filter.

20. The detector of claim 17, wherein the control means includes:

means for allowing the control means to continue to cause the holding device to sample and hold the value indicative of the instantaneous amplitude of the carrier waveform at phases which remain consistent, even when the carrier waveform is substantially reduced in magnitude.

21. The detector of claim 20, wherein the means for allowing includes:

a phase locked loop, locked in frequency and phase to the carrier waveform, for providing a continuous-phase signal for detection of the maximum-magnitude value even when the carrier waveform is substantially reduced in magnitude.

22. The detector of claim 17, wherein the control means includes:

a buffer which receives the carrier waveform and provides a buffered waveform;

first slope indication means, responsive to the buffered waveform, for providing a first slope indication signal which changes state substantially at peaks of positive and negative polarity;

second slope indication means, responsive to the buffered waveform, for providing a second slope indication signal which changes state substantially at peaks of positive and negative polarity;

a first differentiator which is responsive to the first slope indication signal to provide to the first switch's control input, a narrow pulse constituting the first sample signal; and a second differentiator which is responsive to the second slope indication signal to provide to the second switch's control input, a narrow pulse constituting the second sample signal.

23. The detector of claim 22, wherein:

the buffer includes an operational amplifier.

24. The detector of claim 22, wherein the control means further includes:

a phase locked loop, responsive to the buffered waveform and which provides a reference signal to the slope indication means even when the buffered waveform is small in magnitude.

25. The detector of claim 22, wherein the first and second slope indication means include:

a) a shared low pass filter (LPF) which is responsive to a first signal derived directly from the buffered waveform and which provides a slightly delayed version of the first signal; and b) respective comparators, each comparator having:
1) a first input which is directly responsive to the first signal;
2) a second input which is responsive to the delayed version of the first signal; and
3) a comparator output which changes the slope indication signal's value when the first input's value crosses the second input's value.

26. The detector of claim 22, wherein each differentiator of the fast and second differentiators includes:

a delay element which substantially determines the time delay which expires during the subsequent pulse of the carrier waveform.

27. The detector of claim 22, wherein the control means further includes:

first and second limiters which clip respective narrow pulses of a predetermined polarity so that only narrow pulses of a second polarity opposite the predetermined polarity affect the respective first and second sample signals.

28. The detector of claim 22, wherein:

a) the buffer includes an operational amplifier;

b) the control means further includes a phase locked loop, responsive to the buffered waveform and which provides a reference signal to the slope indication means even when the buffered waveform is small in magnitude;

c) the first and second slope indication means include:
1) a shared low pass filter (LPF) which is responsive to a first signal derived directly from the buffered waveform and which provides a slightly delayed version of the first signal; and
2) respective comparators, each comparator having:
   i) a first input which is directly responsive to the first signal;
   ii) a second input which is responsive to the delayed version of the first signal; and
   iii) a comparator output which changes the slope indication signal's value when the first input's value crosses the second input's value;

d) each differentiator of the first and second differentiators includes a delay element which substantially determines the time delay which expires during the subsequent pulse of the carrier waveform; and e) the control means further includes first and second limiters which clip respective narrow pulses of a predetermined polarity so that only narrow pulses of a second polarity opposite the predetermined polarity affect the respective first and second sample signals.

29. The detector of claim 22, wherein:

the control means constitutes a hardware circuit.

30. The detector of claim 29, wherein:

the hardware circuit includes discrete active and passive electronic components.

* * * * *